United States Patent [19]

Song et al.

[11] Patent Number: 5,789,360

[45] Date of Patent: Aug. 4, 1998

[54] CLEANING SOLUTION FOR USE ON A SEMICONDUCTOR WAFER FOLLOWING CHEMICAL-MECHANICAL POLISHING OF THE WAFER AND METHOD FOR USING SAME

[75] Inventors: Jae-inh Song, Kyungki-do; Young-jun Cho, Seoul; Heung-soo Park, Seoul; Young-bum Koh, Seoul, all of Rep. of Korea

[73] Assignee: Samsung Electronics Co., Ltd., Rep. of Korea

[21] Appl. No.: 778,135

[22] Filed: Jan. 2, 1997

[30] Foreign Application Priority Data

Mar. 4, 1996 [KR] Rep. of Korea ............ 96-5547

[51] Int. Cl.$^6$ ............... C11D 3/06; C11D 3/02; C23G 1/02; B08B 3/08
[52] U.S. Cl. ............... 510/175; 134/3; 134/42; 134/41; 134/38
[58] Field of Search ............... 510/175, 176, 510/178; 134/2, 38, 42, 3, 41

[56] References Cited

U.S. PATENT DOCUMENTS

| | | | |
|---|---|---|---|
| 3,811,974 | 5/1974 | Squillace et al. | 156/8 |
| 3,859,222 | 1/1975 | Squillace et al. | 252/79.3 |
| 3,979,238 | 9/1976 | Justice | 156/3 |
| 4,230,522 | 10/1980 | Martin et al. | 156/638 |
| 4,671,851 | 6/1987 | Beyer et al. | 156/645 |
| 4,828,743 | 5/1989 | Rahfield et al. | 252/87 |
| 4,910,155 | 3/1990 | Cote et al. | 437/8 |
| 4,944,836 | 7/1990 | Beyer et al. | 156/645 |
| 5,058,799 | 10/1991 | Zsamboky | 228/124 |
| 5,389,194 | 2/1995 | Rostoker et al. | 156/636 |
| 5,460,694 | 10/1995 | Schapira et al. | 216/104 |
| 5,523,513 | 6/1996 | Milner | 588/1 |
| 5,669,980 | 9/1997 | McNeil et al. | 134/3 |
| 5,683,816 | 11/1997 | Goodreau | 428/461 |

FOREIGN PATENT DOCUMENTS

| | | |
|---|---|---|
| 795628 | 9/1997 | European Pat. Off. |
| 153027 | 12/1981 | Germany. |
| 97/27001 | 7/1997 | WIPO. |
| 97/41278 | 11/1997 | WIPO. |

*Primary Examiner*—Douglas J. McGinty
*Attorney, Agent, or Firm*—Myers Bigel Sibley & Sajovec, P.A.

[57] ABSTRACT

A solution and method for cleaning a silicon wafer following a chemical-mechanical polishing process is disclosed. The cleaning solution being 0.1% to 99% by total solution volume of phosphoric acid, 0.1% to 25% by total solution volume of fluoroboric acid, and the balance of the solution, deionized water.

14 Claims, 2 Drawing Sheets

CLEANING SOLUTION FOR USE ON A SEMICONDUCTOR WAFER FOLLOWING CHEMICAL-MECHANICAL POLISHING OF THE WAFER AND METHOD FOR USING SAME

BACKGROUND OF THE INVENTION

The present invention relates to a solution for cleaning silicon wafers on which semiconductor devices are formed. The cleaning solution finds particular application in cleaning wafers following a chemical-mechanical polishing (CMP) process. The present invention also relates to a cleaning method for silicon wafers using the foregoing solution.

More particularly, the present invention relates to cleaning solution for removing a layer of contaminants, including metal ions and slurry residue, from the surface of the silicon wafer which typically forms when the surface of the wafer is polished. The cleaning solution is also particularly useful in removing a damaged surface portion of an insulating layer which typically results from CMP process(es) routinely performed on a silicon wafer during the fabrication of semiconductor devices.

As semiconductor devices become more highly integrated and multilayer interconnections become the norm, global (i.e., wafer-wide) planarization of the "layers" formed on the silicon wafer are required to secure the margin demanded by photolitho-graphic processes, and to minimize interconnection lengths. Currently, there are various techniques for planarizing these layers such as a boro-phospho-silicate glass (hereinafter, referred to as BPSG) reflow, an aluminum (Al) reflow, a spin on glass (hereinafter, referred to as SOG) process, etch back processes; and CMP processes.

Among these, CMP processes are the most effective planarizing technique for many high density semiconductor devices, because CMP is performed at low-temperatures, unlike the various reflow processes. Furthermore, unlike many etch back processes, CMP provide global planarization.

Conventional CMP processes are well documented. Generally, CMP subjects a silicon wafer to a polishing pad in a slurry of chemical fluid(s) containing one or more abrasives (surfactant). The combination of chemical fluid(s) and abrasives effectively planarize the surface of the wafer. Specific examples of CMP processes are disclosed in U.S. Pat. Nos. 4,671,851, 4,910,155 and 4,944,836. As will be seen from a review of these and other references teaching CMP, the slurry often contains $H_2O_2$, $KIO_3$ and an acid or base for pH adjustment, and $Al_2O_3$, ceria and/or silica as an abrasive.

However, when a wafer is subjected to a CMP process using one or more of above-mentioned abrasives, various contaminants such as residual slurry and metal ions typically adhered to the surface of the wafer. Such residual contaminants, as well as the physical damage inflicted by the mechanical polishing, result in a highly undesirable surface composition for the wafer.

FIG. 1 illustrates a portion of a wafer having semiconductor devices formed therein/thereon which has been subjected to CMP. In FIG. 1, reference numeral 11 denotes the semiconductor substrate, reference numeral 21 denotes an insulating layer, typically an oxide layer, having a contact hole exposing a predetermined region of the semiconductor substrate 11, reference numeral 31 denotes a defective layer formed in an upper portion of the insulating layer 21, reference numeral 41 denotes a barrier layer formed on bottom and side wall portions of the contact hole, reference numeral 51 denotes a conductive layer, for example, tungsten or aluminum, filling the contact hole, reference numeral 61 denotes a contaminated layer formed on the surface of the wafer by the CMP process, and reference numeral 71 denotes contaminants such as metal ions and slurry residue contained in contaminated layer 61.

Thus, following CMP, contaminated layer 61 including contaminants 71 must be removed, and defective layer 31 must be stripped away from the remaining portion of the insulating layer. An ideal cleaning solution would, therefore, meet several requirements, including:

completely removing the contaminated layer;

efficiently stripping the defective layer while leaving the underlying insulating layer undamaged;

leaving the barrier layer and conductive layer substantially unaffected by the cleaning solution;

preserving the topology of the semiconductor device; and, ensuring that the contaminants removed from the wafer's surface during the cleaning process do not re-adhered.

Wet cleaning processes are typical of the conventional means used on wafers following CMP. One preferred wet cleaning process comprises a spin scrubbing of the wafer in a solution of deionized water and a surfactant which effectively removes the contaminants. Wet etching in hydrofluoric acid or an ammonia solution has also been used as a conventional cleaning method.

Wet etching, an isotropic process, is typically the best method for removing the contaminated layer or stripping the defective layer. However, when both metal layers, i.e., the barrier layer and the conductive layer, as well as the insulating layer are exposed to the etching solution, it is difficult to selectively etch only the insulating layer. More likely, the metal layer(s) are also attacked by the etching solution at the time the defective portion of the insulating layer is stripped. Thus, wet etching processes, while effective in stripping the defective layer, often destroy the topology of the semiconductor devices formed on the wafer.

Plasma etching has also been used to remove the contaminated layer or strip the defective layer from the wafer. Unlike the above-described wet cleaning processes, plasma etching is a "dry" process. However, plasma etching is disadvantageous in that several kinds of contaminants can not be simultaneously removed, and in that contaminants removed during the plasma etching process tend to re-adhered to the wafer surface. As a result, plasma etching must typically be followed by another cleaning process such as a wet cleaning.

Thus, if the selectivity ratio of a wet etching process is carefully controlled so as to etch only the contaminated layer and the defective portion of the insulating layer, wet etching is preferred to dry. In general, a wet cleaning process is performed by dipping a wafer into a bath containing a cleaning solution, or by spraying the cleaning solution onto the surface of the wafer while it is being spun. In any wet cleaning method, the type and mix ratio of cleaning solution components are important since these parameters largely control the etching selectivity.

Many conventional cleaning solutions are known. U.S. Pat. No. 5,389,194 discloses a cleaning solution essentially consisting of hydrofluoric acid and phosphoric acid. However, the hydrofluoric acid contained in the cleaning solution induces several adverse side effects. First, it is known to etch metal barrier layers, bonding pad, and other metal layer elements common to semiconductor devices. Second, when hydrofluoric acid is mixed with phosphoric acid, it is difficult to control an exact mix ratio with respect to phosphoric acid due to its low molecular weight. Third, repeated etching steps using hydrofluoric acid often result in variations in the etching rate between steps due to the volatility of hydrofluoric acid. Thus, the overall cleaning process can be unstable and difficult to predict.

FIG. 2 illustrates another problem with the use of conventional wet cleaning methods using a cleaning solution containing hydrofluoric acid. In FIG. 2, reference numeral 12 denotes a semiconductor substrate, reference numeral 22 denotes an insulating layer having a contact hole exposing a predetermined portion of semiconductor substrate 12, and reference numeral 52 denotes a conductive layer filling the contact hole. The arrows "a" represent points at which the cleaning solution tends to permeate the barrier layer. (See element 41 in FIG. 1). Arrow "b" indicates the resulting effect of cleaning solution permeation, wherein conductive layer 52 lifts away from the barrier layer.

Thus, the hydrofluoric acid component in the cleaning solution excessively reacts with the barrier layer, as well as generally aiding in the creation of the contaminated layer. (See element 61 in FIG. 1). This excessive reaction undesirably etches the barrier layer, and causes the conductive layer to lift. As a result, the topology of the semiconductor device is seriously damaged and performance of the resulting semiconductor devices greatly deteriorated. Furthermore, metal ions remaining on the surface of the oxide layer after polishing tend to resist the cleaning method since hydrofluoric acid causes a pitting phenomenon.

SUMMARY OF THE INVENTION

The foregoing disadvantages in conventional cleaning solutions and methods are remedied by a cleaning solution according to the present invention. The present invention is particularly useful in cleaning a silicon wafer following a chemical-mechanical polishing process. The cleaning solution comprises phosphoric acid, fluoroboric acid and deionized water. Preferably, the content of the phosphoric acid is 0.1 to 99% the total solution volume, and the content of the fluoroboric acid is 0.1 to 25% the total solution volume, and the balance of the solution is deionized water. The cleaning solution may also include one or more surfactant(s), being ionic or nonionic, and forming 0.001% to 0.1% the volume of the phosphoric acid.

The present invention also provides a method for applying the above cleaning solution to a semiconductor device formed on a silicon wafer. More particularly, the cleaning solution is applied to a contaminated layer formed by a chemical-mechanical polishing process overlaying an upper insulating layer of the semiconductor device. In addition to removing the contaminated layer the cleaning solution effectively strips a defective layer formed in an upper portion of the insulating layer. More preferably, the cleaning solution is applied at a temperature in a range of from 15° to 50° C.

BRIEF DESCRIPTION OF THE DRAWINGS

The advantages of the present invention will become more apparent upon consideration of a preferred embodiment with reference to the attached drawings in which.

DETAILED DESCRIPTION OF THE INVENTION

Figure 1:
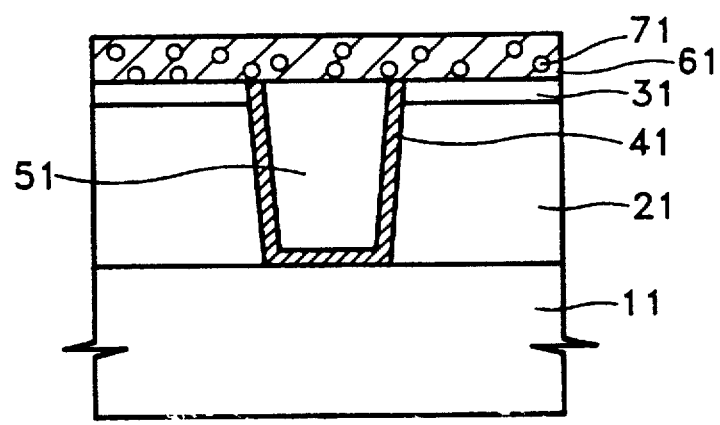
FIG. 1 is a sectional view of a semiconductor device following chemical-mechanical polishing.
Figure 2:
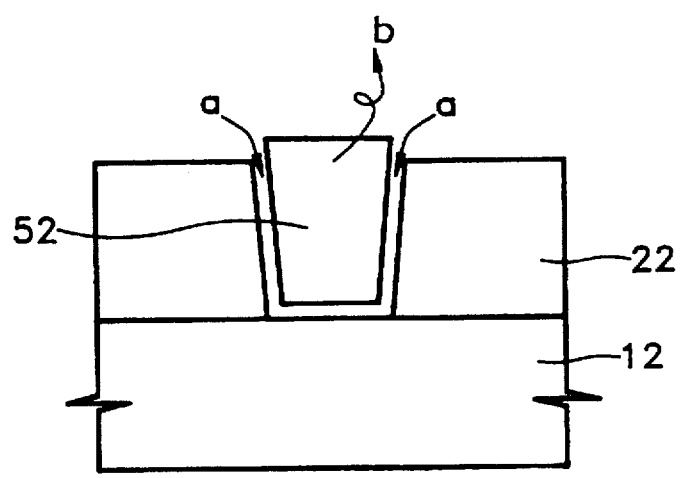
FIG. 2 is a sectional view illustrating problems with conventional cleaning solutions and methods.

The present invention provides a cleaning solution for wet cleaning a wafer having semiconductor devices formed thereon which effectively removes a contaminated upper of the wafer layer. Contaminants include metal ions and slurry residue. The present invention also strips away the defective upper portion of an insulating layer without adversely effecting a barrier layer and a conductive layer formed in the insulating layer. To accomplish these results, the present invention provides a cleaning solution comprising 0.1 to 99% by total solution volume of phosphoric acid, 0.1 to 25% by total solution volume of fluoroboric acid, and the balance deionized water. The exact content of fluoroboric acid in the cleaning solution, is determined by the nature of the contaminated layer and the defective layer, as well as overall cleaning conditions.

In this cleaning solution, fluoroboric acid is the solution component which removes the contaminated layer of metal ions and slurry residue. As shown in the following dissociation equation of fluoroboric acid, hydrofluoric acid (HF) generated by dissociating fluoroboric acid participates in the etching reaction thereby removing the contaminants:

$$HBF_4 \leftrightharpoons HF + BF_3 \qquad (1)$$

On the other hand, phosphoric acid is the solution component which prohibits the non-defective portion of the insulating layer underlying the defective layer from being excessively etched by the fluoroboric acid. Additionally, the phosphoric acid component bonds with the metal ions to form a metal salt which is easily removed. In this manner, the above described cleaning solution comprising fluoroboric acid and phosphoric acid removes the contaminated layer and selectively strips the defective layer without attacking the barrier layer and plugging conductive layer.

With reference to the above solution concentrations, if the cleaning solution contains less than 0.1% total volume of fluoroboric acid, the cleaning solution has poor etching capability with respect to the contaminated layer and the defective layer. Furthermore, too low a concentration of fluoroboric acid leads to difficulties in controlling the mix ratio with phosphoric acid.

However, when the solution concentration of fluoroboric acid exceeds 25% total volume, the insulating layer is overetched and insufficient process margin is obtained. Furthermore, if excessive fluroboric acid is used in the cleaning solution, hydrogen fluoride is generated in too great an amount and attacks the barrier layer and conductive layer.

It is preferred that the cleaning solution of the present invention further comprise ionic or nonionic surfactant. The content of the surfactant is preferably 0.001 to 0.1% the volume of phosphoric acid and fluoroboric acid. The ionic or nonionic surfactant improves the wettability and morphology of the silicon wafer surface after chemical treatment and prevents the contaminants from re-adhering during the cleaning process.

The foregoing cleaning solution is preferably applied in at a temperatures in a range of from 15° to 50° C. The exact temperature at which the cleaning solution is applied is determined according to the nature of the barrier layer, the state of the contaminated layer and the defective layer, as well as other cleaning conditions.

Figure 3A:
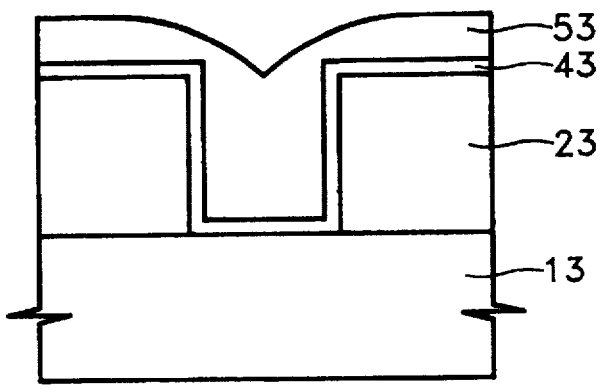
FIGS. 3A to 3C are views for sequentially explaining a cleaning method according to the present invention for a semiconductor device following chemical-mechanical polishing of a silicon wafer incorporating the semiconductor device.
Figure 3B:
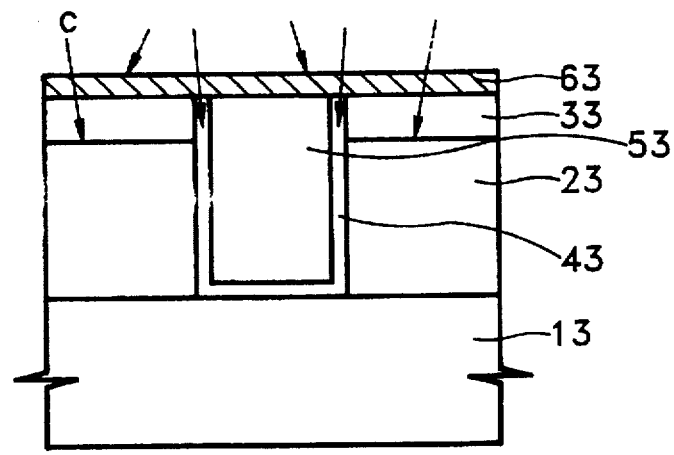
Figure 3C:
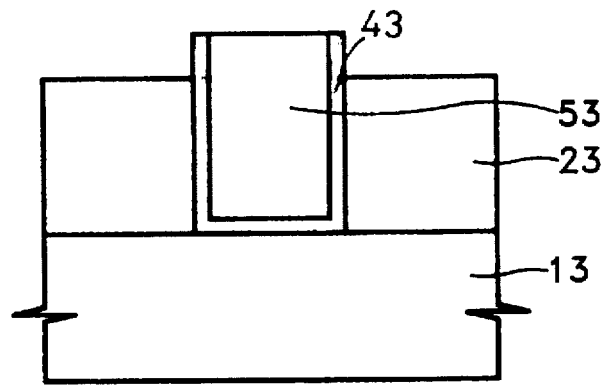

The present invention will be described in greater detail with reference to FIGS. 3A to 3C. In FIGS. 3A to 3C, reference numeral 13 denotes a semiconductor substrate, reference numeral 23 denotes an insulating layer, typically an oxide layer, having a contact hole formed therein to expose a predetermined portion of semiconductor substrate 13, reference numeral 33 denotes a defective upper surface portion of insulating layer 23, reference numeral 43 denotes a barrier layer, reference numeral 53 denotes a conductive layer filling the contact hole and reference numeral 63 denotes a contaminated layer overlaying the entire structure. The arrow sign "c" represents the degree to which the cleaning solution of the present invention permeates the contaminated layer 63 and defective layer 33.

As shown in FIG. 3A which is a sectional view illustrating a semiconductor device before CMP, the conductive layer 53 filling contact hole has an uneven surface. Therefore, such semiconductor substrate is subjected to CMP, to thereby obtain a semiconductor device having a smooth, albeit damaged and contaminated, surface shown in FIG. 3B. During CMP the polishing pad and slurry mechanically and chemically react with the surface of the wafer to form contaminated layer 63. Further, the chemical reaction inherent in CMP forms defective layer 33 in an upper surface portion of insulating layer 23. As previously noted, contaminated layer 63 and defective layer 33 would induce malfunction in the underlying semiconductor device if left untreated. Thus, the semiconductor device must be cleaned to remove the contaminated layer 63 and defective layer 33.

FIG. 3C is a sectional view of the semiconductor device following cleaning. As shown in FIG. 3C, when the CMP-processed semiconductor device (shown in FIG. 3B) is subjected to the wet cleaning process using a cleaning solution containing fluoroboric acid and phosphoric acid of the present invention, the contaminated layer (63 in FIG. 3B) can be completely removed and the defective layer (33 in FIG. 3B) can be efficiently stripped back without etching the barrier layer (43 in FIG. 3B). Thus, the desirable topology is retained.

As described above, the cleaning solution of the present invention not only has an excellent cleaning effect on the contaminated layer including contaminants such as metal ions and slurry residue, but also effectively strips back the defective layer from the surface of insulating layer without adverse effect on the barrier layer. Furthermore, the cleaning solution of the present invention contributes to stable, wafer-global, cleaning process which ultimately reduces overall production costs.

One skilled in the art will recognize from the foregoing examples that modifications and variations can, and are expected to be made, to the foregoing cleaning solution in accordance with varying conditions inherent in the production process. The embodiments above are given by way of example. For example, the specific discussion of barrier layer preservation is indicative of other metal, metal alloy, and polysilicon structures protected by the proposed cleaning solution and method. The teaching examples do not limit the present invention which is defined by the following claims.

What is claimed is:

1. A cleaning solution for use on a silicon wafer following a chemical-mechanical polishing process, the cleaning solution consists essentially of: 0.1 to 99 volume percent of phosphoric acid, 0.1 to 25 volume percent of fluoroboric acid, a surfactant, and water.

2. A cleaning method for a semiconductor device, the semiconductor device comprising an insulating layer formed over a surface of a silicon wafer, wherein a contaminated layer formed by a chemical-mechanical polishing process overlays the insulating layer, and wherein a defective layer is formed in an upper portion of the insulating layer by the chemical-mechanical polishing process, the method comprising the step of:

applying a cleaning solution to the surface of the silicon wafer to remove the contaminated layer and the defective layer, wherein the cleaning solution consists essentially of 0.1 to 99 volume percent of phosphoric acid, 0.1 to 25 volume percent of fluoroboric acid, a surfactant, and water.

3. The cleaning method of claim 2, wherein the surfactant is ionic.

4. The cleaning solution of claim 1, wherein the surfactant is ionic.

5. The cleaning solution of claim 1, wherein the surfactant is nonionic.

6. The cleaning solution as claimed in claim 1, wherein the surfactant consists essentially of 0.001% to 0.1% of the volume of the phosphoric acid.

7. A cleaning method for a silicon wafer comprising the step of applying a cleaning solution to a surface of the silicon wafer, wherein the cleaning solution consists essentially of 0.1 to 99 volume percent of phosphoric acid, 0.1 to 25 volume percent of fluoroboric acid, a surfactant, and water.

8. The cleaning method of claim 2, wherein the surfactant is nonionic.

9. The cleaning method of claim 2, wherein the surfactant consists essentially of 0.001% to 0.1% of the volume of the phosphoric acid.

10. The cleaning method of claim 7, wherein the surfactant is ionic.

11. The cleaning method of claim 7, wherein the surfactant is nonionic.

12. The cleaning method of claim 7, wherein the surfactant consists essentially of 0.001% to 0.1% of the volume of the phosphoric acid.

13. The cleaning method of claim 7, wherein the cleaning solution is applied at a temperature in a range of from 15° to 50° C.

14. The cleaning method of claim 2, wherein the cleaning solution is applied at a temperature in a range of from 15° to 50° C.

* * * * *